United States Patent
Chaudhari et al.

(10) Patent No.: US 8,916,455 B2
(45) Date of Patent: Dec. 23, 2014

(54) METHOD OF GROWING HETEROEPITAXIAL SINGLE CRYSTAL OR LARGE GRAINED SEMICONDUCTOR FILMS ON GLASS SUBSTRATES AND DEVICES THEREON

(71) Applicants: Karin Chaudhari, Briarcliff Manor, NY (US) Ashok Chaudhari, Briarcliff Manor, NY (US) Pia Chaudhari, Briarcliff Manor, NY (US)

(72) Inventors: Praveen Chaudhari, Briarcliff Manor, NY (US); Jifeng Liu, Hanover, NH (US)

(73) Assignees: Solar Tectic LLC, Briarcliff Manor, NY (US); Trustees of Dartmouth College, Hanover, NH (US)

( * ) Notice: Subject to any disclaimer, the term of this patent is extended or adjusted under 35 U.S.C. 154(b) by 0 days.

(21) Appl. No.: 14/341,433

(22) Filed: Jul. 25, 2014

(65) Prior Publication Data

US 2014/0331915 A1  Nov. 13, 2014

Related U.S. Application Data

(63) Continuation-in-part of application No. 13/495,699, filed on Jun. 13, 2012, now abandoned.

(60) Provisional application No. 61/505,795, filed on Jul. 8, 2011.

(51) Int. Cl.
*H01L 21/20* (2006.01)
*H01L 21/36* (2006.01)
*H01L 21/02* (2006.01)
*C03B 29/06* (2006.01)

(52) U.S. Cl.
CPC .......... *C03B 13/24* (2013.01); *H01L 21/02636* (2013.01); *C03B 13/34* (2013.01); *C03B 29/06* (2013.01)
USPC ............................ 438/479; 438/481; 438/478

(58) Field of Classification Search
None
See application file for complete search history.

(56) References Cited

U.S. PATENT DOCUMENTS

| | | | |
|---|---|---|---|
| 3,983,012 A | 9/1976 | Cohen | |
| 4,355,084 A * | 10/1982 | Kitchen | 428/672 |
| 4,534,820 A | 8/1985 | Mori et al. | |
| 5,326,719 A | 7/1994 | Green et al. | |
| 2006/0208257 A1 | 9/2006 | Branz et al. | |
| 2006/0252235 A1 | 11/2006 | Aberle et al. | |
| 2007/0044832 A1 | 3/2007 | Fritzemeier | |
| 2008/0217622 A1 | 9/2008 | Goyal | |
| 2009/0278233 A1 | 11/2009 | Pinnington | |

(Continued)

OTHER PUBLICATIONS

Xiang, Bin et. al., In Situ TEM Near-Field Optical Probing of Nanoscale Silicon Crystallization, American Chemical Society, Nano Letters, Apr. 3, 2012, pp. 2524-2529, ACS Publications, US.

(Continued)

*Primary Examiner* — Charles Garber
*Assistant Examiner* — Brigitte Paterson
(74) *Attorney, Agent, or Firm* — Keith D. Nowak; Libby Babu Varghese; Carter Ledyard & Milburn, LLP

(57) ABSTRACT

Inexpensive semiconductors are produced by depositing a single crystal or large grained silicon on an inexpensive substrate. These semiconductors are produced at low enough temperatures such as temperatures below the melting point of glass. Semiconductors produced are suitable for semiconductor devices such as photovoltaics or displays.

13 Claims, 3 Drawing Sheets

(56) References Cited

U.S. PATENT DOCUMENTS

| | | | |
|---|---|---|---|
| 2009/0297774 A1* | 12/2009 | Chaudhari | 428/149 |
| 2009/0309104 A1 | 12/2009 | Im et al. | |
| 2010/0270558 A1 | 10/2010 | Ro et al. | |
| 2012/0240843 A1* | 9/2012 | Machuca | 117/39 |
| 2013/0058827 A1 | 3/2013 | Bjoerk et al. | |

OTHER PUBLICATIONS

Teplin et. al., "Low-Temperature Silicon Hompepitaxy by hot-wire chemical vapor deposition with a TA filament", Journal of Crystal Growth, Science Direct, Jan. 4, 2006, vol. 287, pp. 2414-418, Elsevier, US.

Rath J. K, "Low temperature polycrystalline silicon: a review on deposition, physical properties and solar cell applications", Solar Energy Materials & Solar Cells, vol. 76, 2003, pp. 431-487, Elsevier, US.

Uematsu et al. "Very-Low-Temperature Silicon Epitaxy by Plasma-CVD using SiH4-Ph3-H2 Reactants for Bipolar Devices", Apr. 1988, vol. 4, pp. L493-L495, Japanese Journal of Applied Physics, Japan.

* cited by examiner

METHOD OF GROWING HETEROEPITAXIAL SINGLE CRYSTAL OR LARGE GRAINED SEMICONDUCTOR FILMS ON GLASS SUBSTRATES AND DEVICES THEREON

PRIORITY AND RELATED APPLICATION

This application claims priority to U.S. patent application Ser. No. 13/495,699, filed Jun. 13, 2012, and U.S. Provisional Patent Application Ser. No. 61/505,795, filed Jul. 8, 2011, both entitled "METHOD OF GROWING HETEROEPITAXIAL SINGLE CRYSTAL OR LARGE GRAINED SEMICONDUCTOR FILMS ON GLASS SUBSTRATES AND DEVICES THEREON," which are hereby incorporated by reference in their entirety.

FEDERAL FUNDING

N/a.

FIELD OF THE INVENTION

The present invention relates to producing large grained to single crystal semiconductor films, such as silicon films, for producing articles such as photovoltaic and other electronic devices.

BACKGROUND OF THE INVENTION

Over the last half century there have been numerous attempts to produce inexpensive semiconductor, particularly silicon, films of high quality suitable for semiconductor devices such as photovoltaics or displays. There are millions of devices which rely on some of the more successful techniques for growing semiconductor films. This, the desire to reduce cost, is an ongoing process requiring a continuous stream of small and large innovations.

Primarily cost and/or efficiency of devices made from silicon semiconductor films materials are the central issues. For example, single crystal silicon photovoltaic devices have high efficiency but are expensive compared to amorphous silicon which is relatively inexpensive to produce but devices that use it have relatively low efficiency. Single crystal silicon films can be deposited on the surfaces of single crystal silicon or sapphire. Deposition of single crystal silicon on sapphire below the melting point of glass has recently been proven, but both sapphire and single crystal silicon substrates are expensive. The ability to deposit single crystal or large grained silicon on an inexpensive substrate such as glass would therefore be very desirable. To some extent, this has also been accomplished. For example, large grained silicon films have been grown by scanning a laser beam that heats, melts, and crystallizes a silicon film deposited on glass; large grains are produced in the direction of the laser scan. However, these grains are not produced at a low enough temperature, i.e. below the melting point of glass. Large grain means the grain size is comparable to or larger than the carrier diffusion length such that electron-hole recombination at grain boundaries is negligible. In semiconductor thin films this means that the grain size is greater than or equal to the film thickness.

Here a method for producing inexpensive semiconductor, particularly silicon, films of high quality suitable for semiconductor devices such as photovoltaics or displays is disclosed. A method is also disclosed for depositing such film on an inexpensive substrate, such as glass. A method is further disclosed for depositing such film at temperatures below the melting point of glass.

ASPECTS OF THE INVENTION

It is an aspect of the present invention to produce inexpensive semiconductor, particularly silicon, films of high quality suitable for semiconductor devices such as photovoltaics or displays.

It is yet another aspect of this invention to produce inexpensive semiconductor, particularly silicon, films of high quality suitable for semiconductor devices such as photovoltaics or displays which can be deposited on inexpensive substrates such as glass.

It is yet another aspect of this invention to produce inexpensive semiconductor, particularly silicon, films of high quality suitable for semiconductor devices such as photovoltaics or displays which can be deposited on inexpensive substrates such as glass, and which can be deposited at a low temperature.

SUMMARY OF THE INVENTION

In accordance with one aspect of the present invention, the forgoing and other objects can be achieved by depositing semiconductor films from a eutectic alloy solution.

In accordance with another aspect of the present invention, a thin film consisting of a eutectic alloy, for example Au—Si, is deposited on a glass substrate and a heated line source is scanned across the surface of the film at a temperature where the alloy melts.

In accordance with yet another aspect of the present invention, said melting subsequently solidifies by the passage of the heating source, and silicon nucleates on the glass substrate with the metal, Au, on top.

In accordance with yet another invention, the thermal gradient produced by the passing of the heat source causes the silicon grains to continue to grow rather than nucleate a new grain.

In accordance with yet another aspect of the present invention, a eutectic alloy, such as Au—Si, is deposited instead of pure silicon, which enables the process to be carried out at a lower temperature than in the laser scan, as it is currently practiced.

This process is very similar to the laser scan described in the literature except that it uses an alloy consisting of a semiconductor and a metal, for example Au—Si, instead of pure silicon. This enables the process to be carried out at a lower temperature than in the laser scan, as it is currently practiced. The temperature of the film and the substrate is below the softening temperature of glass. The relatively slow scan rate and the liquid gold silicon alloy enables seeding of silicon and propagation of this single crystal orientation across the glass substrate.

DETAILED DESCRIPTION OF THE INVENTION

Figure 1:
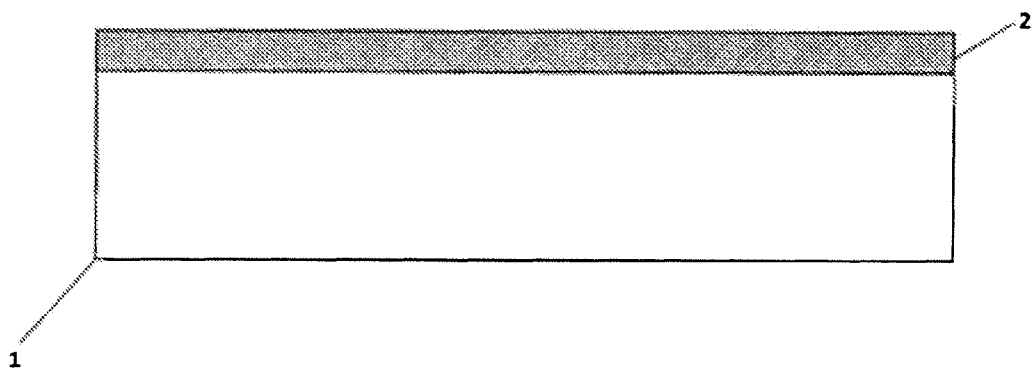
FIG. 1 is a cross sectional illustration of a eutectic alloy semiconductor layer on a non-single crystal substrate or template.
Figure 2:
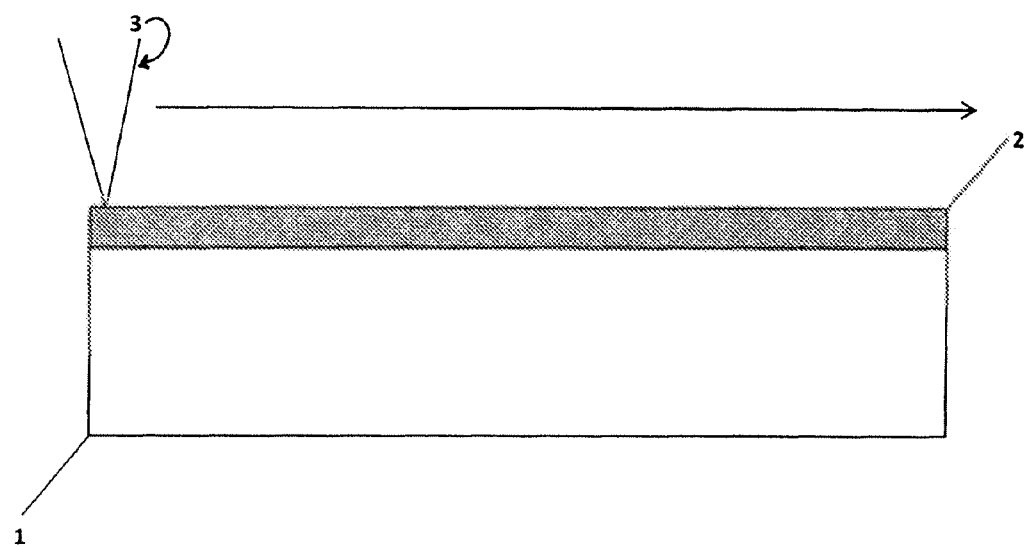
FIG. 2 is a cross sectional illustration showing an initial phase of heating and nucleating Si.
Figure 3:
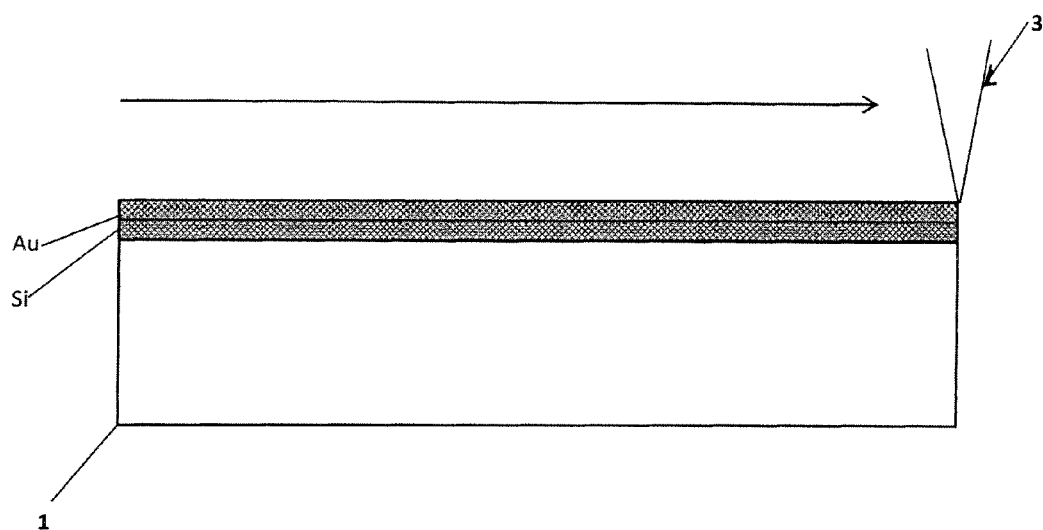
FIG. 3 is a cross sectional illustration showing the passage of the heat source across the film and substrate.
Figure 4:
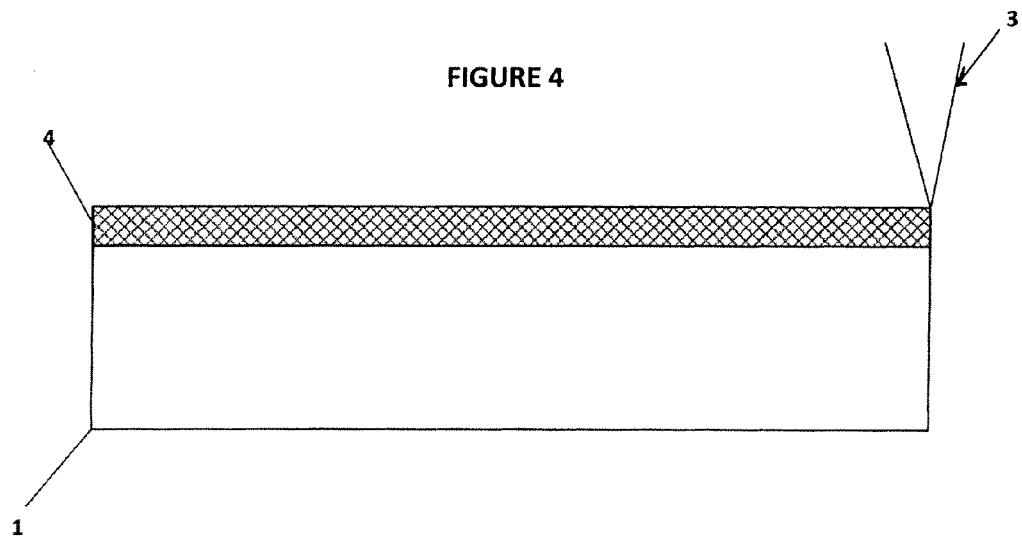
FIG. 4 is a cross sectional illustration showing crystallized Si on the template or substrate.

FIG. 1 shows a thin film of a Si—Au alloy 2 deposited on a non-single crystal substrate or template 1 such as a glass substrate. The film 2 is about 100 nm in thickness. The composition is chosen such that the liquidus temperature is slightly below the glass softening temperature. For example, for soda lime glass the softening temperature is ~600° C., and, in one non-limiting embodiment, the composition chosen for Au—Si system is between 18 and 30 atomic % Si. The substrate 1 with the Au—Si film 2 is placed in a vacuum chamber or in an inert environment in which Si stays relatively pure. As shown in FIG. 2, a heat source 3 shaped as a line source and with radiant heat is focused on to the film 2 surface. The heat source 3 is placed at one end of the substrate 1 with film 2 thereon and then moved slowly across the substrate 1. In one example, the heat melts the Au—Si film 2 at a temperature between the eutectic temperature (in this case 363° C.) and the liquidus temperature (in this case <600° C.) such that the eutectic alloy thin film remains in solid phase and coexists with an Au-rich liquid phase according to the phase diagram. As the heat source 3 moves away from the liquid zone, see FIG. 3, silicon nucleates onto the glass substrate and the crystallized silicon 4 grows as the heat source moves away from it. See FIG. 4. In another example, the heated line has a temperature below the eutectic temperature of the Au—Si system. The Si reacts with Au in solid phase through atomic diffusion, and in the process precipitates from the solid solution to heterogeneously nucleate, say on the surface of the glass substrate to form large crystal grains of Si.

Figure 5:
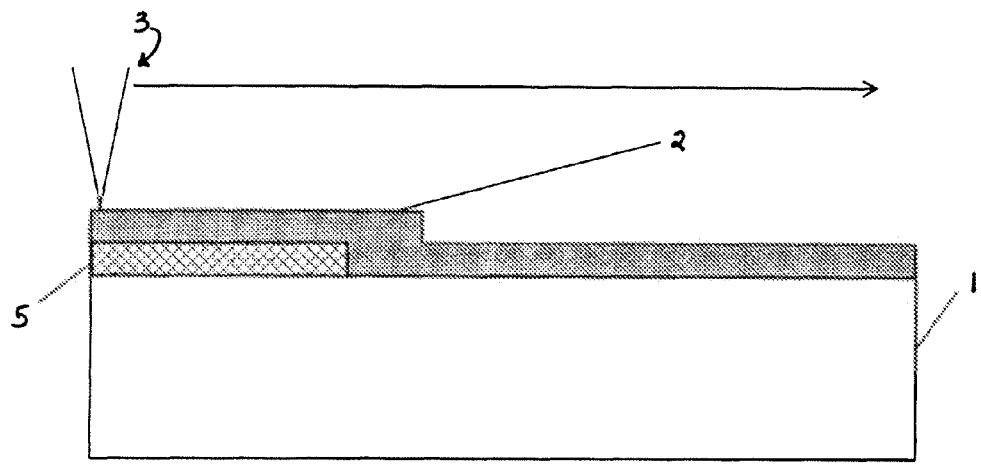
FIG. 5 is a cross sectional illustration of a eutectic alloy semiconductor layer on a single crystal strip of Si wafer on a non-single crystal substrate or template.
Figure 6A:
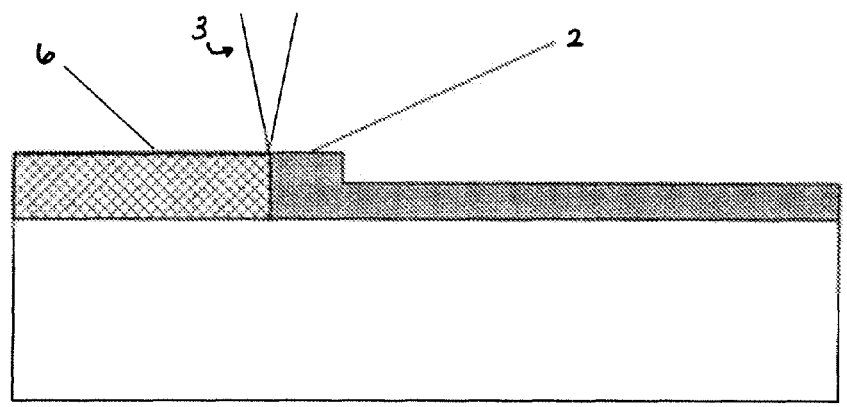
FIG. 6A is a cross sectional illustration showing an initial phase of heating and the semiconductor layer.
Figure 6B:
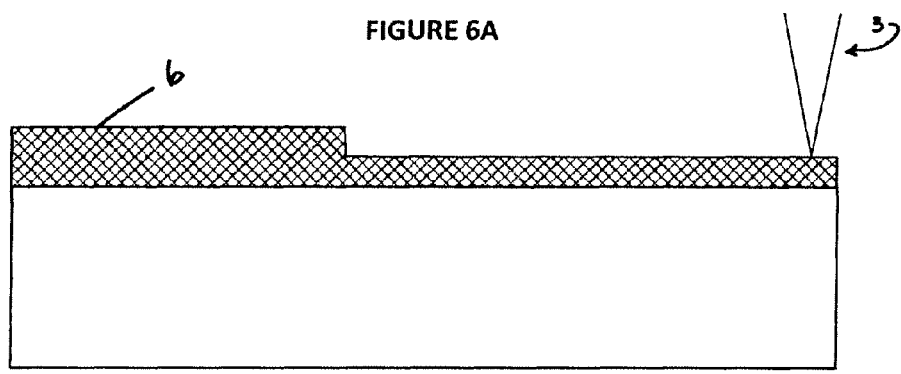
FIG. 6B is a cross sectional illustration showing the crystal orientation propagated after scanning is complete.

Referring now to FIG. 5, if a single crystal film is desired, a thin strip of single crystal 5 cut from a commercially available silicon wafer is placed at one end and a Si—Au film 2 deposited onto the crystal surface 5 and the glass substrate 1. The heat source 3 is brought on top of the single crystal strip 5 and scanned away from it to propagate its crystal orientation across the entire semiconductor thin film 6 over the glass substrate 1. In one non-limiting embodiment, the heated lines has a temperature such that the eutectic alloy thin film remains solid, including coexistence with an Au-rich liquid phase. See FIGS. 6A and 6B.

If desired, the Au film can be etched away leaving a silicon film on the glass substrate. This film can now be used, much as a single crystal silicon surface is used, to subsequently deposit appropriately doped silicon films determined by the requirements of the device.

In a similar way, one can use Sn—Si, Al—Si or Ag—Si as the starting eutectic thin film. The eutectic temperature of the Ag—Si system is above the glass softening temperature (typically 600 deg. Centigrade) of the substrate. Hence it is not possible to use a liquid phase to deposit Si from the alloy. Rather, in this case a solid phase is used. The Si reacts with Ag and in the process precipitates from the solid solution to heterogeneously nucleate, say on the surface of the glass substrate to form large crystal grains. With the seedling of a single crystalline Si strip similar to FIGS. 5 and 6, single crystal growth replicating the orientation of the strip can also be achieved.

While the present invention has been described in conjunction with specific embodiments, those of normal skill in the art will appreciate the modifications and variations can be made without departing from the scope and the spirit of the present invention. Such modifications and variations are envisioned to be within the scope of the appended claims.

The invention claimed is:

1. A method of growing single crystal semiconductor film comprising the steps of:
   providing a substrate;
   placing a thin strip of single crystal semiconductor at one end of the substrate;
   depositing a eutectic alloy film in solid phase on a surface of the single crystal strip and the substrate;
   directing a heated line source on top of the single crystal strip; and
   scanning the heated line source away from the single crystal strip propagating its crystal orientation across the entire semiconductor thin film, said eutectic alloy thin film remains entirely in solid phase during the heated line scan.

2. The method of claim 1, wherein the eutectic alloy film is Au—Si.

3. The method of claim 2, wherein the Au diffuses onto the top of the Si film during the heated line scanning process and is etched away after the growth of the Si film.

4. The method of claim 1, wherein the eutectic alloy film is Al—Si.

5. The method of claim 1, wherein the eutectic alloy film is Ag—Si.

6. The method of claim 1, wherein the eutectic alloy film is Sn—Si.

7. The method of claim 1, wherein the heat source is a laser.

8. The method of claim 7, wherein said laser is a beam and is shaped as a line.

9. The method of claim 1, wherein a thermal gradient is produced by the passing of the heated line source, said thermal gradient causing the semiconductor grains to continue to grow rather than nucleate a new grain.

10. The method of claim 1, wherein said deposition occurs at a temperature below the softening temperature of glass.

11. The method of claim 1, wherein after the heated line scanning process, the semiconductor film is single crystal.

12. The method of claim 1, wherein the substrate is glass.

13. The method of claim 1, wherein the single crystal strip is primarily single crystal Si.

\* \* \* \* \*